United States Patent
Shimada et al.

(10) Patent No.: US 10,310,007 B2
(45) Date of Patent: Jun. 4, 2019

(54) SEMICONDUCTOR APPARATUS AND SYSTEM

(71) Applicant: RENESAS ELECTRONICS CORPORATION, Tokyo (JP)

(72) Inventors: Masaki Shimada, Tokyo (JP); Kan Takeuchi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 160 days.

(21) Appl. No.: 14/973,561

(22) Filed: Dec. 17, 2015

(65) Prior Publication Data

US 2016/0291078 A1 Oct. 6, 2016

(30) Foreign Application Priority Data

Mar. 30, 2015 (JP) .................................. 2015-069427

(51) Int. Cl.
*G01R 31/26* (2014.01)
*G01R 31/28* (2006.01)

(52) U.S. Cl.
CPC ..... *G01R 31/2642* (2013.01); *G01R 31/2834* (2013.01)

(58) Field of Classification Search
CPC .... G01R 31/26; G01R 31/28; G01R 31/2642; G01R 31/2644; G01R 31/2834; G01R 31/2849; G01R 31/28456; G01R 31/003; G01R 31/3012; G01R 31/3187
See application file for complete search history.

(56) References Cited

U.S. PATENT DOCUMENTS

| | | | | |
|---|---|---|---|---|
| 6,128,757 | A | * | 10/2000 | Yousuf .................. G01R 31/30 714/724 |
| 7,877,657 | B1 | | 1/2011 | Miller et al. |
| 8,094,706 | B2 | | 1/2012 | Kim et al. |
| 8,301,411 | B2 | | 10/2012 | Okayasu |

(Continued)

FOREIGN PATENT DOCUMENTS

| | | |
|---|---|---|
| JP | 2003-068865 A | 3/2003 |
| JP | 2005-227124 A | 8/2005 |

(Continued)

OTHER PUBLICATIONS

Japanese Office Action issued in corresponding Japanese Patent Application No. 2015-069427, dated Oct. 9, 2018, with English Translation.

*Primary Examiner* — Son T Le
(74) *Attorney, Agent, or Firm* — McDermott Will & Emery LLP

(57) ABSTRACT

An object of the invention is to provide a semiconductor apparatus capable of achieving conditions that are stricter than the conditions in which the stable operation is guaranteed, without increasing the circuit size. A semiconductor apparatus (10) includes a semiconductor circuit (11); a voltage generator (12) that selects one of at least two types of voltages and applies a power supply voltage, the at least two types of voltages including a normal voltage at which the semiconductor circuit (11) normally operates and a low voltage which is lower than the normal voltage; and a clock generator (13) that supplies the semiconductor circuit (11) with a clock signal having a constant frequency regardless of the power supply voltage.

5 Claims, 10 Drawing Sheets

(56) References Cited

U.S. PATENT DOCUMENTS

| | | | |
|---|---|---|---|
| 2002/0066912 A1* | 6/2002 | Tsuchiya | H01L 27/0802 257/203 |
| 2002/0191469 A1* | 12/2002 | Honma | G11C 5/14 365/226 |
| 2013/0013247 A1 | 1/2013 | Sato et al. | |

FOREIGN PATENT DOCUMENTS

| | | |
|---|---|---|
| JP | 2010-524101 A | 7/2010 |
| JP | 2013-061841 A | 4/2013 |
| JP | 5737524 B2 | 6/2015 |
| WO | 2009/011028 A1 | 1/2009 |

* cited by examiner

SEMICONDUCTOR APPARATUS AND SYSTEM

CROSS-REFERENCE TO RELATED APPLICATIONS

This application is based upon and claims the benefit of priority from Japanese patent application No. 2015-069427, filed on Mar. 30, 2015, the disclosure of which is incorporated herein in its entirety by reference.

BACKGROUND

The present invention relates to a semiconductor apparatus and a system.

There is a method for diagnosing an operation failure to improve the reliability of a semiconductor apparatus. For example, Japanese Unexamined Patent Application Publication No. 2003-68865 discloses a method and an apparatus which are capable of performing an automatic diagnosis of a semiconductor device upon power activation of the semiconductor device, which enables diagnosis of a failure or the like in the operation of the semiconductor device due to a deterioration with age.

As a specific diagnosis method, Published Japanese Translation of PCT International Publication for Patent Application, No. 2010-524101 discloses a technique of changing a clock frequency, estimating a maximum operating frequency at which a normal operation can be performed, and measuring the age and lifetime of a system based on the maximum operating frequency.

Similarly, International Patent Publication No. WO 2011/115038 discloses a semiconductor apparatus capable of detecting a deterioration in a circuit to be tested. In this technique, a test control unit causes a clock generator to change a test operation frequency, and a whole control unit calculates a deterioration amount based on the maximum test operation frequency.

Thus, techniques have been studied in which conditions that are stricter than the conditions in which the stable operation is guaranteed are set by changing a clock frequency to be supplied to a semiconductor apparatus and the semiconductor apparatus is diagnosed based on the maximum frequency at which the normal operation can be performed.

SUMMARY

However, the method disclosed in Published Japanese Translation of PCT International Publication for Patent Application, No. 2010-524101 requires a circuit for generating a clock frequency different from that for the normal operation. This causes an increase in the circuit size of the semiconductor apparatus.

Other problems to be solved by and novel features of the present invention will be apparent from the following description and the accompanying drawings.

A first aspect of the present invention is a semiconductor apparatus including: a semiconductor circuit; a voltage generator that selects one of at least two types of voltages and applies a power supply voltage, the at least two types of voltages including a normal voltage at which the semiconductor circuit normally operates and a low voltage which is lower than the normal voltage; and a clock generator that supplies the semiconductor circuit with a clock signal having a constant frequency regardless of the power supply voltage.

According to the first aspect, it is possible to provide a semiconductor apparatus capable of achieving conditions that are stricter than the conditions in which the stable operation is guaranteed, without increasing the circuit size.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
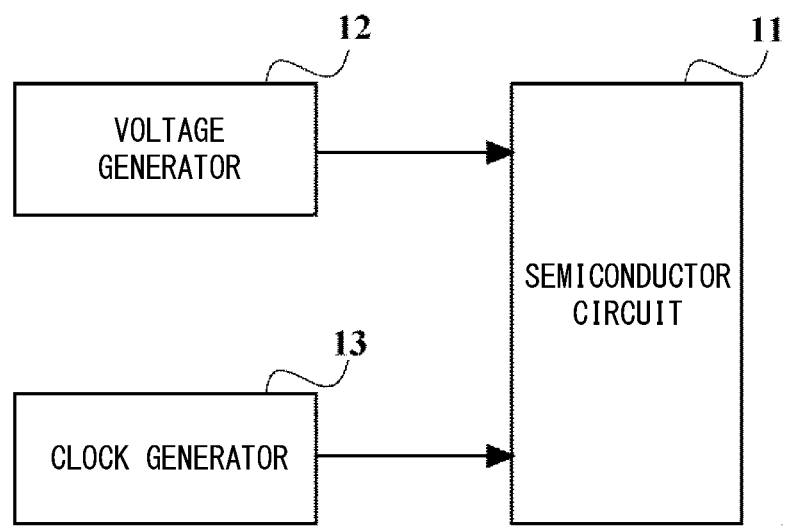
FIG. 1 is a block diagram showing a schematic configuration of a semiconductor apparatus according to an embodiment.

The following description and the drawings are abbreviated or simplified as appropriate for clarity of explanation. The elements illustrated in the drawings as functional blocks for performing various processes can be implemented hardwarewise by a CPU, a memory, and other circuits, and softwarewise by a program loaded into a memory or the like. Accordingly, it is understood by those skilled in the art that these functional blocks can be implemented in various forms including, but not limited to, hardware alone, software alone, and a combination of hardware and software. Note that in the drawings, the same elements are denoted by the same reference numerals, and a repeated description is omitted as needed.

In the following embodiments, explanations are made by referring to several sections or several embodiments for convenience, as required, but they are mutually related, and are in such a relation to each other that one of them is a modified example, an application example, a detailed explanation, a supplemental explanation, or the like of apart or all of the other, unless otherwise specified. Further, in the following embodiments, when the number of elements (including the number of items, numerical value, quantity, range, etc.) or the like is mentioned, the number is not limited to that specific number, and may be larger or smaller than the mentioned number, except for the case where it is explicitly indicated that the number should be the specifically-mentioned number or it is theoretically clear that the number should be limited to the specifically-mentioned number.

Further, in the following embodiments, the constituent elements thereof (including operation steps etc.) are not necessarily indispensable, except for the case where it is explicitly indicated that a specific element is indispensable, or it is theoretically clear that a specific element is indispensable. Similarly, in the following embodiments, when shapes, positional relationships, etc. of the constituent elements are mentioned, they include substantially similar or analogous shapes and so forth, except for the case where it is explicitly indicated or it is theoretically clear that the above is not true. This also applies to the above-mentioned values (including the number of items, numerical value, quantity, range, etc.) and the like.

Outline of Embodiments

FIG. 1 is a block diagram showing a schematic configuration of a semiconductor apparatus according to an embodiment. Referring to FIG. 1, a semiconductor apparatus 10 includes a semiconductor circuit 11, a voltage generator 12, and a clock generator 13.

The semiconductor circuit 11 is a circuit having a configuration in which a plurality of electronic components, such as a transistor, a resistor, and a capacitor, are integrated on a substrate.

The voltage generator 12 is a power supply that supplies electric power to the semiconductor circuit 11, and can change a voltage to be applied. For example, the voltage generator 12 selects one of at least two types of voltages, i.e., a normal voltage at which the semiconductor circuit normally operates and a low voltage which is lower than the normal voltage, and supplies the semiconductor circuit 11 with electric power.

The clock generator 13 generates a clock signal with a constant frequency, and supplies the clock signal to the semiconductor circuit 11. The frequency of the clock signal output from the clock generator 13 is constant regardless of the voltage applied by the voltage generator 12. In other words, even when the voltage generator 12 changes the voltage from the normal voltage to the low voltage, which is lower than the normal voltage, the clock generator 13 outputs the clock signal with the same frequency.

Next, an example of the operation of the semiconductor apparatus 10 will be described.

When the semiconductor apparatus 10 performs a normal operation, the voltage generator 12 supplies the electric power to the semiconductor circuit 11 at the normal voltage at which the semiconductor circuit normally operates. Further, the clock generator 13 supplies the semiconductor 11 with the clock signal with a constant frequency.

When the conditions in which the semiconductor apparatus 10 operates are changed to stricter conditions, the voltage generator 12 changes the voltage to be applied to the semiconductor circuit 11 from the normal voltage, at which the semiconductor circuit normally operates, to the low voltage which is lower than the normal voltage. However, the clock generator 13 supplies the semiconductor circuit 11 with the clock signal with the same frequency.

Figure 2:
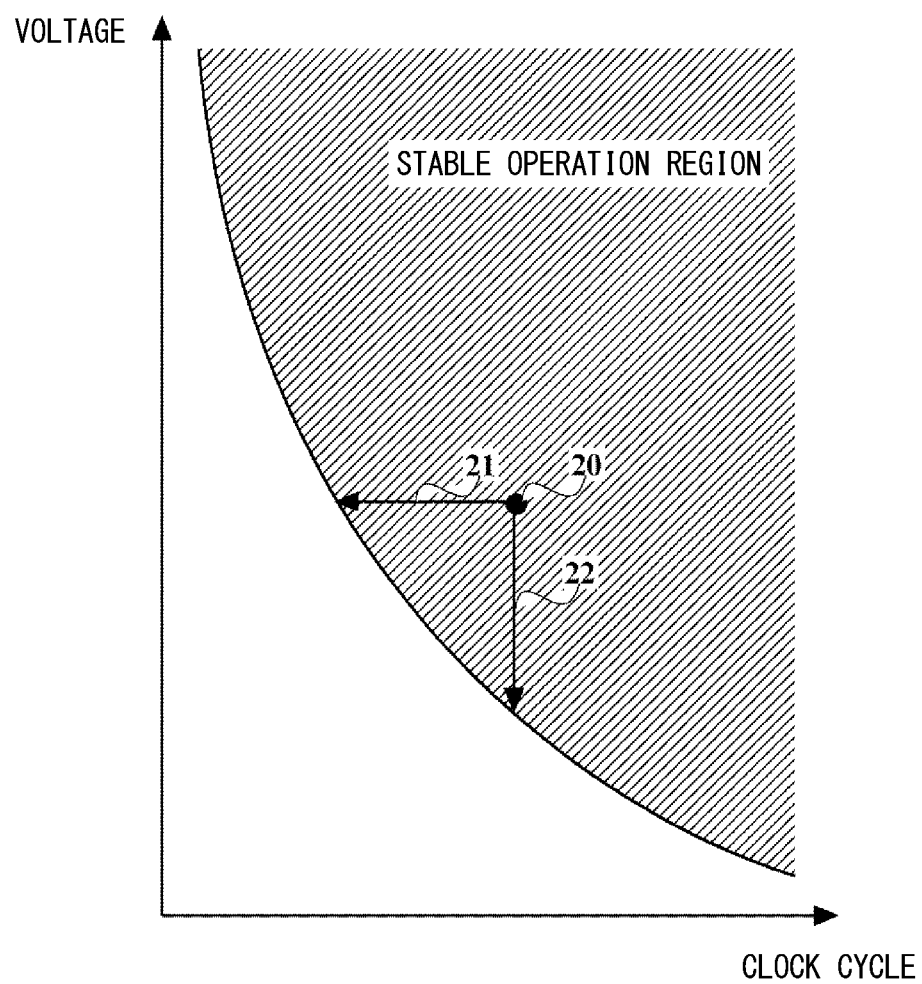
FIG. 2 is a graph showing a relationship between a voltage to be applied to a semiconductor circuit and a cycle of a clock signal to be supplied to the semiconductor circuit.

FIG. 2 is a graph showing a relationship between a voltage to be applied to the semiconductor circuit and a cycle of a clock signal to be supplied to the semiconductor circuit. In FIG. 2, the horizontal axis represents the cycle of the clock signal to be supplied to the semiconductor circuit 11, and the vertical axis represents the voltage to be applied to the semiconductor circuit 11. In FIG. 2, a hatched region represents a region in which the semiconductor circuit 11 operates stably.

Referring to FIG. 2, concerning a combination 20 of the clock cycle and the voltage at which the stable operation is guaranteed, the boundary of the conditions in which stable operation is ensured is diagnosed in Published Japanese Translation of PCT International Publication for Patent Application, No. 2010-524101 or International Patent Publication No. WO 2011/115038.

On the other hand, in this embodiment, a change indicated by an arrow 22, i.e., a voltage, is varied, and the boundary of the conditions in which the semiconductor circuit 11 operates stably (or the conditions in which the semiconductor circuit 11 does not operate stably) is diagnosed without changing the clock frequency.

In general, it is difficult for a circuit that generates a clock signal with a normal operation frequency to increase the frequency, and thus there is a need to prepare a circuit capable of generating a clock signal with a highest frequency.

On the other hand, it is possible to lower the voltage only by adding a configuration for lowering the voltage to a circuit that generates a voltage for normal operation, without increasing the circuit size.

Thus, in the semiconductor apparatus according to this embodiment, the power supply voltage is changed to the low voltage, which is lower than the normal voltage at which the semiconductor circuit normally operates, without changing the clock frequency, thereby achieving the conditions that are stricter than the conditions in which the stable operation is guaranteed, without increasing the circuit size.

First Embodiment

Figure 3:
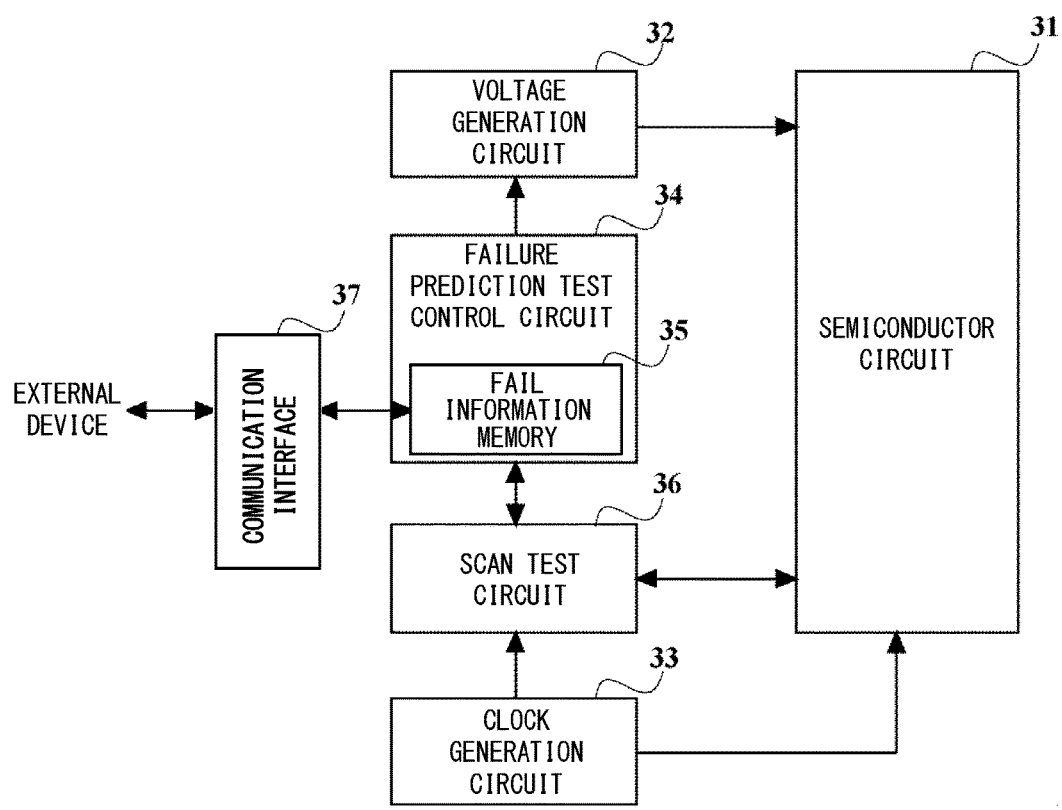
FIG. 3 is a block diagram showing a configuration of a semiconductor apparatus according to a first embodiment.

In a first embodiment, a semiconductor apparatus that conducts a test as to whether a semiconductor circuit normally operates or not will be described. FIG. 3 is a block diagram showing the configuration of the semiconductor apparatus according to the first embodiment. Referring to FIG. 3, a semiconductor apparatus 30 includes a semiconductor circuit 31, a voltage generation circuit 32, a clock generation circuit 33, a failure prediction test control circuit 34, a fail information memory 35, a scan test circuit 36, and a communication interface 37.

The semiconductor circuit 31 is a circuit corresponding to the semiconductor circuit 11 shown in FIG. 1. The semiconductor circuit 31 is a circuit having a configuration in which a plurality of electronic components, such as a transistor, a resistor, and a capacitor, are integrated on a substrate. The semiconductor circuit 31 is a semiconductor circuit which is a block to be tested. For example, in a scan test, the semiconductor circuit 31 uses scan flip-flops in the circuit. Further, during a test mode, the semiconductor circuit 31 serially connects the scan flip-flops in the circuit to form a shift register, thereby forming a path (scan chain) with which the scan flip-flops can be controlled and observed from the scan test circuit 36.

The voltage generation circuit 32 is a circuit corresponding to the voltage generator 12 shown in FIG. 1. The voltage generation circuit 32 can change a voltage to be applied. The voltage generation circuit 32 is, for example, a power supply that supplies electric power to the semiconductor circuit 31. The voltage generation circuit 32 selects one of at least two types of voltages, i.e., a normal voltage at which the semiconductor circuit normally operates and a low voltage which is lower than the normal voltage, and supplies the semiconductor circuit 31 with electric power. The voltage generation circuit 32 sets a voltage in accordance with an instruction from the failure prediction test control circuit 34.

The clock generation circuit 33 is a circuit corresponding to the clock generator 13 shown in FIG. 1. The clock generation circuit 33 generates a clock signal with a constant frequency and supplies the clock signal to the semiconductor circuit 31. The frequency of the clock signal output from the clock generation circuit 33 is constant regardless of the voltage applied by the voltage generation circuit 32. In other words, even when the voltage generation circuit 32 changes the voltage from the normal voltage to the low voltage, which is lower than the normal voltage, the clock generation circuit 33 outputs the clock signal with the same frequency.

The failure prediction test control circuit 34 is a circuit that performs a control in a test for the semiconductor circuit 31. The failure prediction test control circuit 34 sends an instruction on the voltage in a normal-voltage test or a low-voltage test to the voltage generation circuit 32, and instructs the scan test circuit 36 to execute the test. Specifically, the failure prediction test control circuit 34 instructs the semiconductor 31 to set the low voltage, which is lower than the normal voltage at which the semiconductor circuit normally operates, in the low-voltage test.

Further, the failure prediction test control circuit 34 stores test execution results in the fail information memory 35. The fail information memory 35 is a memory that stores test fail information.

The scan test circuit 36 is a circuit that executes a test as to whether the semiconductor circuit 31 normally operates or not. For example, upon receiving the instruction on the normal-voltage test or the low-voltage test from the failure prediction test control circuit 34, the scan test circuit 36 generates a test pattern and executes the test on the semiconductor circuit 31. During the low-voltage test, the scan test circuit 36 generates a test pattern similar to that for the normal-voltage test, and executes the test on the semiconductor circuit 31.

The communication interface 37 is an interface for communicating the execution results of the failure prediction test with an external device. Specifically, the communication interface 37 transmits the test fail information stored in the fail information memory 35.

Figure 4:
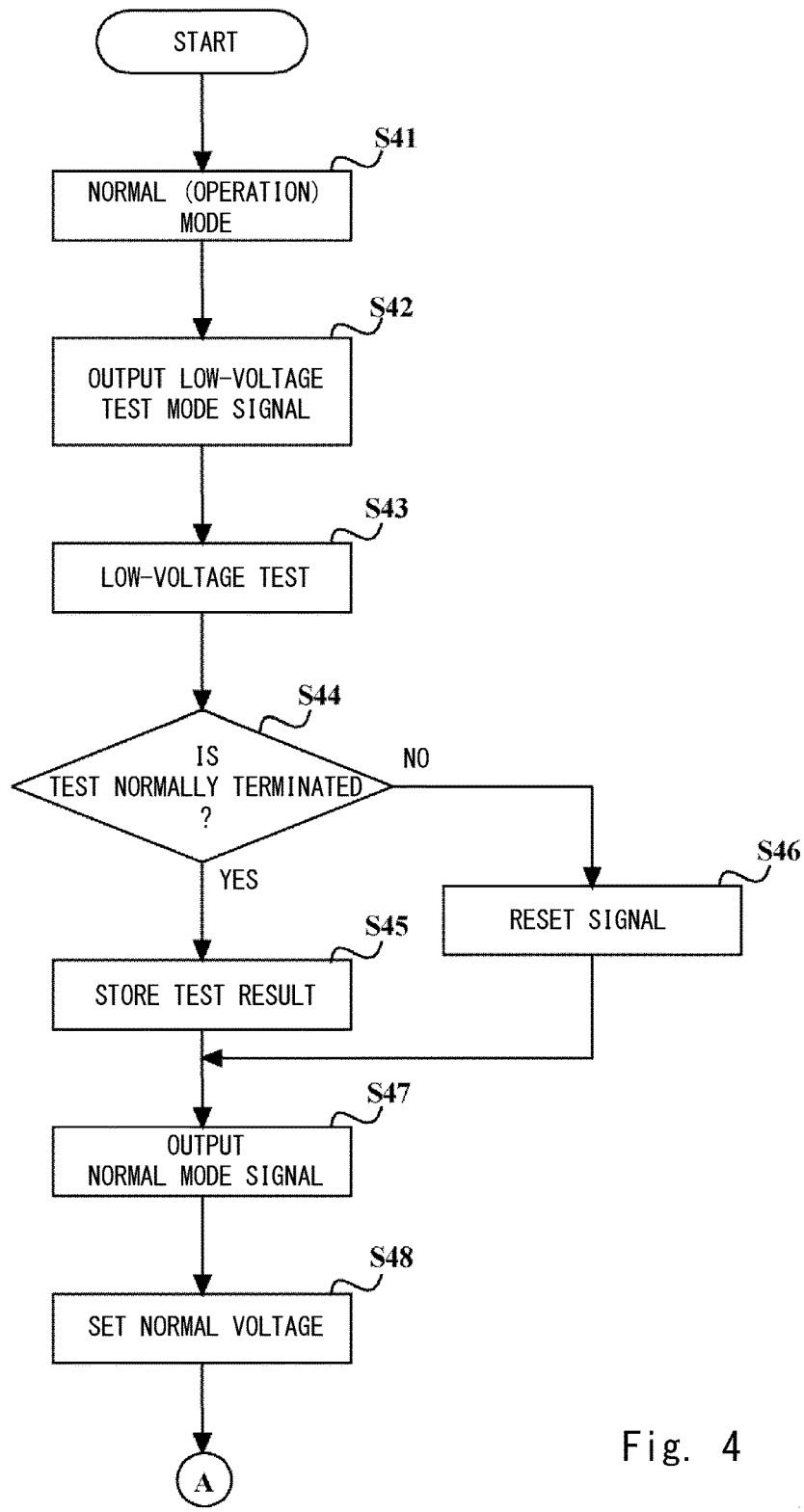
FIG. 4 is a flowchart showing an operation of the semiconductor apparatus according to the first embodiment.
Figure 5:
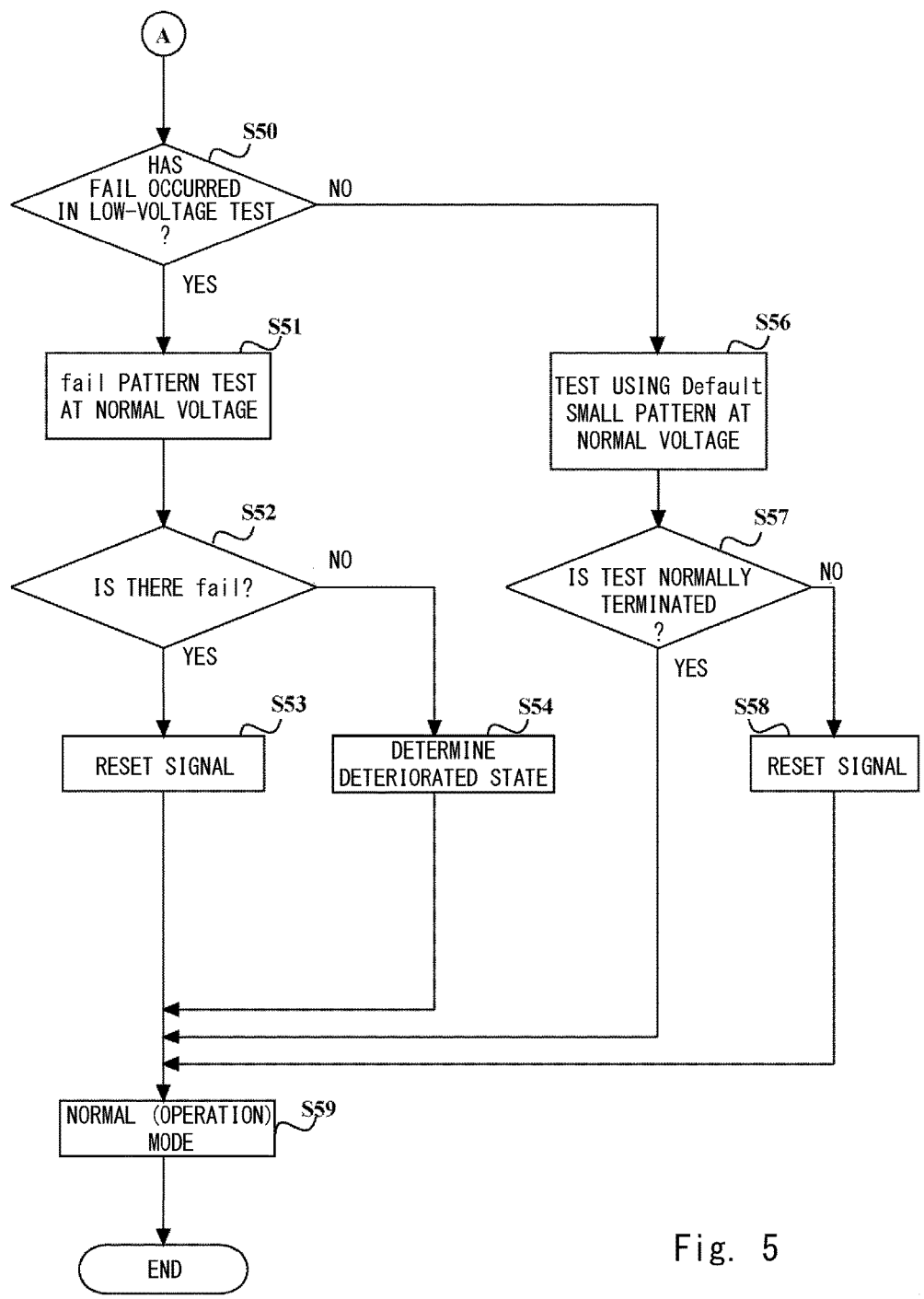
FIG. 5 is a flowchart showing an operation of the semiconductor apparatus according to the first embodiment.

With the above configuration, the semiconductor apparatus 30 conducts a test. Next, the operation of the semiconductor apparatus 30 will be described. FIGS. 4 and 5 are flowcharts showing the operation of the semiconductor apparatus according to the first embodiment.

First, in step S41, the semiconductor apparatus 30 shifts to a normal (operation) mode, and advances to step S42.

In step S42, the failure prediction test control circuit 34 receives a low-voltage test mode signal output from the inside of the semiconductor apparatus 30 or from the external device, and advances to step S43. Specifically, the low-voltage test is carried out when a field test for estimating a deterioration amount is conducted on a system operating in the market. The timing for carrying out the low-voltage test may vary depending on the system. The timing is, for example, a time when the power is turned on, during idling, or a time when the power is turned off.

In step S43, the failure prediction test control circuit 34 starts the low-voltage test, and advances to step S44. Specifically, the failure prediction test control circuit 34 outputs, to the voltage generation circuit 32, a control signal to set the low voltage which is lower than the normal voltage at which the semiconductor circuit 31 normally operates. The voltage generation circuit 32 sets the voltage to be applied to the semiconductor circuit 31 to the low voltage which is lower than the normal voltage at which the semiconductor circuit 31 normally operates. The scan test circuit 36 causes the test circuit to transmit the test pattern, and executes the test. The failure prediction test control circuit 34 stores the test result in the fail information memory 35.

In step S44, the failure prediction test control circuit 34 determines whether the test is normally terminated or not. When the test is normally terminated, the process advances to step S45. When the test is not normally terminated, the process advances to step S46. Specifically, after the end of the test in step S43, or after a lapse of a certain period of time, the failure prediction test control circuit 34 outputs, to the voltage generation circuit 32, a control signal to change the voltage to be applied to the semiconductor circuit 31 to the normal voltage at which the semiconductor circuit 31 normally operates, and determines whether the test is normally terminated or not based on whether the control signal is triggered after the end of the test or after a lapse of a certain period of time.

In step S45, the failure prediction test control circuit 34 stores the test execution result in the fail information memory 35, and advances to step S47.

In step S46, after the test execution result is stored in the fail information memory 35, the failure prediction test control circuit 34 outputs a reset signal to the semiconductor apparatus 30, and advances to step S47.

In step S47, the failure prediction test control circuit 34 receives a normal mode signal, and advances to step S48.

In step S48, the failure prediction test control circuit 34 outputs a control signal to set the normal voltage to the voltage generation circuit 32, and advances to step S50.

In step S50, the failure prediction test control circuit 34 checks whether the entire system has been restored to its original state after returning from the test mode to the normal operation. Specifically, the failure prediction test control circuit 34 reads out the contents of the fail information memory 35, and checks whether a failure has occurred in the low-voltage test. If a failure has occurred, the process advances to step S51 and further advances to step S56 in which no failure has occurred.

In step S51, the failure prediction test control circuit 34 executes a fail pattern test at the normal voltage, and advances to step S52. Specifically, the failure prediction test control circuit 34 outputs, to the voltage generation circuit 32, a control signal to set the normal voltage at which the semiconductor circuit 31 normally operates. The voltage generation circuit 32 sets the normal voltage as the voltage to be applied to the semiconductor circuit 31. The scan test circuit 36 causes the test circuit to transmit the test pattern, which is the same as the test pattern used in the low-voltage test, and executes the test.

In step S52, the failure prediction test control circuit 34 checks whether the result of the normal-voltage test shows fail. If the test result shows fail, the process advances to step S53. If the test result does not show fail, the process advances to step S54.

In step S53, the results of both the low-voltage test and the normal-voltage test show fail, and thus the failure prediction test control circuit 34 determines that a failure has occurred in the semiconductor circuit 31, stores the test execution result in the fail information memory 35, outputs a reset signal to the semiconductor apparatus 30, and advances to step S59.

In step S54, the result of the low-voltage test shows fail and the result of the normal-voltage test does not show fail, and thus the failure prediction test control circuit 34 determines that the semiconductor circuit 31 is in a deteriorated state, and advances to step S59.

In step S56, the result of the low-voltage test does not show fail, and thus the failure prediction test control circuit 34 performs a control to conduct a test using a default small pattern at the normal voltage, and advances to step S57. This step S56 is carried out to check whether the system has been restored to the normal (operation) mode and the power supply voltage has been restored.

In step S57, the failure prediction test control circuit 34 determines whether the test using the default small pattern is normally terminated or not. When the test is normally terminated, the process advances to step S59. When the test is not normally terminated, the process advances to step S58.

In step S58, the failure prediction test control circuit 34 stores the test execution result in the fail information memory 35. After that, the failure prediction test control circuit 34 resets the software and conducts the test again. When there is no error as a result of the test, the failure prediction test control circuit 34 determines that the system has been restored to the normal operation state. When there is an error as a result of the test, a process to deal with a failure state is carried out, and the process advances to step S59. In step S59, the failure prediction test control circuit 34 returns to the normal operation mode and stands by.

By the operation described above, the semiconductor apparatus 30 determines one of the normal state, the failure state, and the deteriorated state.

Figure 6:
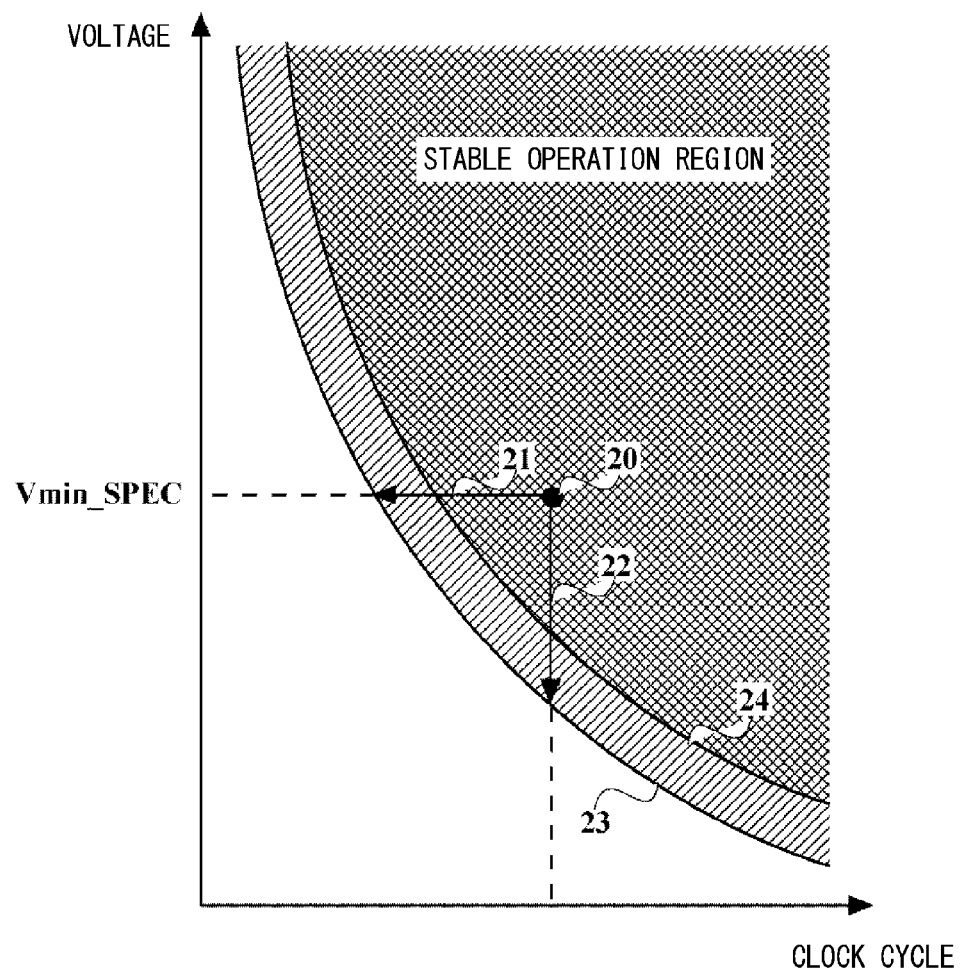
FIG. 6 is a graph showing a relationship between a voltage to be applied to a semiconductor circuit and a cycle of a clock signal to be supplied to the semiconductor circuit.

Next, deteriorated semiconductor characteristics will be described. FIG. 6 is a graph showing a relationship between a voltage to be applied to the semiconductor circuit and a cycle of a clock signal to be supplied to the semiconductor circuit. In FIG. 6, the horizontal axis represents the cycle of the clock signal to be supplied to the semiconductor circuit 31, and the vertical axis represents the voltage to be applied to the semiconductor circuit 31. In FIG. 6, a hatched area represents a region in which the semiconductor circuit 31 operates stably, and a shaded area in which oblique lines cross each other represents a region in which both the semiconductor circuit 31 which is deteriorated and the semiconductor circuit 31 which is not deteriorated operate stably.

A pass/fail boundary which is a boundary between the region in which the semiconductor circuit operates stably and the region in which the semiconductor circuit is determined to be fail as a result of the test deteriorates from a line 23 after shipment to a line 24 after the application of a stress. In other words, a minimum operating voltage at an operating frequency of a product deteriorates in the direction in which the lower limit of the operating voltage increases. If the minimum operating voltage deteriorates to a level lower than a lower limit Vmin SPEC of operating voltage fluctuations assumed in the product, a failure occurs in the chip. The semiconductor apparatus according to the first embodiment conducts a field test at the low voltage that is lower than the normal voltage at which the semiconductor circuit normally operates, and thus can detect that the chip is close to the failure state (i.e., the deteriorated state).

At a design stage, a margin is taken into consideration assuming that the minimum operating voltage will deteriorate after shipment. Accordingly, the result of the low-voltage test of the first embodiment that is conducted at a voltage lower than the Vmin SPEC before shipment does not show fail.

In this manner, the semiconductor apparatus according to the first embodiment conducts tests on the semiconductor circuit at the low power supply voltage, which is lower than the normal voltage at which the semiconductor circuit normally operates, and at the clock frequency which is the same as that of the normal operation. Therefore, the semiconductor apparatus according to the first embodiment can carry out tests under conditions that are stricter than the conditions in which the stable operation is guaranteed, and thus can determine whether the semiconductor circuit has deteriorated or not.

In particular, the semiconductor apparatus according to the first embodiment conducts tests on the semiconductor circuit at the low voltage, which is lower than the normal voltage at which the semiconductor circuit normally operates, and at the clock frequency which is the same as that of the normal operation. When the test result shows fail, the semiconductor circuit is further tested at the normal voltage and at the clock frequency for the normal operation. Then, when the test result does not show fail, the semiconductor apparatus determines that the semiconductor circuit has not deteriorated. Thus, the semiconductor apparatus can determine the deteriorated state of the semiconductor circuit as distinguished from the normal state and the failure state of the semiconductor circuit.

A method for coping with an error generated in the low-voltage test can be determined depending on the specifications of the system. Examples of the method may include an interruption of the system, a permission to use only limited functions, and a simple recording of the deteriorated state.

Second Embodiment

Figure 7:
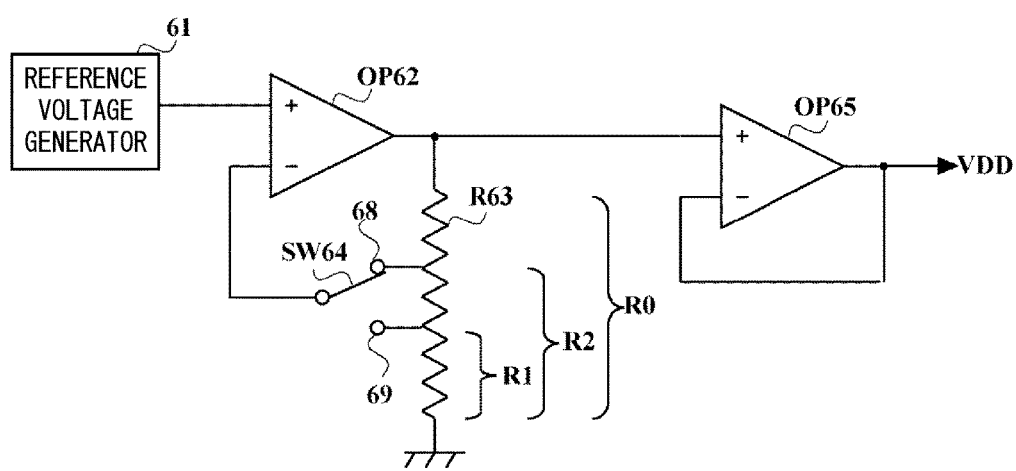
FIG. 7 is a circuit diagram showing a configuration of a voltage generation circuit according to a second embodiment.

In a second embodiment, the detailed configuration of the voltage generation circuit 32 shown in FIG. 3 will be described. FIG. 7 is a circuit diagram showing the configuration of the voltage generation circuit according to the second embodiment. Referring to FIG. 7, the voltage generation circuit 32 includes a reference voltage generator 61, an operational amplifier OP62, a resistor R63, a switch SW 64, and an operational amplifier OP65.

The reference voltage generator 61 generates a reference voltage as a reference. For example, the reference voltage generator 61 is preferably a bandgap reference.

The operational amplifier OP62 is an amplification computing unit. A non-inverting input terminal of the operational amplifier OP62 is connected to the reference voltage generator 61, and an inverting input terminal of the operational amplifier OP62 is connected to the switch SW 64. An output terminal of the operational amplifier OP62 is connected to each of the resistor R63 and a non-inverting input terminal of the operational amplifier OP65.

One end of the resistor R63 is connected to the output terminal of the operational amplifier OP62, and the other end of the resistor R63 is grounded. The resistor R63 is connected to each of terminals 68 and 69 of the switch SW 64 at any locations in the middle of the resistor.

One end of the switch SW 64 is connected to the inverting input terminal of the operational amplifier OP62. The operational amplifier OP65 connects the terminals 68 and 69, which are selectively switched, at any locations in the middle of the resistor R63.

The non-inverting input terminal of the operational amplifier OP65 is connected to the output terminal of the operational amplifier OP62. An inverting input terminal and an output terminal of the operational amplifier OP65 are connected to each other, and the operational amplifier OP65 outputs a predetermined voltage to the semiconductor circuit 31.

Operations of the components shown in FIG. 7 will be described below.

The reference voltage generator 61 generates a reference voltage Vref0, and performs, in each chip, a fine adjustment of a division ratio between R1 and R0 of the resistor R63 that form a feedback loop, for example, so that an output voltage Vref1 of the operational amplifier OP62 is set to a predetermined value during shipment.

The operational amplifier OP62, the resistor R63, and the switch SW 64 constitute a voltage buffer, and constitute a circuit that holds a predetermined voltage in accordance with the reference voltage Vref0 and the division ratio between R1 and R0 of the resistor R63.

The operational amplifier OP65, the resistor R66, and the resistor R67 constitute a regulator, and the operational amplifier OP65 generates a voltage to be applied to the chip based on the reference voltage Vref1.

The fine adjustment of the voltage value of Vref1 is generally performed during the test before shipment in accordance with the ratio between R1 and R0 of the resistor R63 as described above. In the second embodiment, the voltage can be switched to a field test voltage by the switch SW 64.

For example, during a normal use, the switch SW 64 is set to normal, and during a deterioration test in the market, the switch SW 64 is shifted to a field test position, and the test is conducted at the low voltage, which is lower than the normal voltage, and at the frequency which is the same as that of the normal operation. Further, for example, the low-voltage test may also be conducted before shipment, and if the semiconductor circuit is determined to be defective, the shipment of the semiconductor circuit may be cancelled.

During the test at the time of shipment, the voltage information obtained during the field test is preferably stored in a non-volatile memory within the chip as offset information for the normal state. During the field test, the offset information is retrieved and the voltage for the low-voltage test is generated.

Note that a configuration in which the voltage for the low-voltage test can be continuously changed may be employed. In this case, the test voltage at this time is set based on the information on the minimum value Vmin of the voltage at which the semiconductor circuit normally operated in the previous test. This contributes to a reduction of the test time.

Semiconductor chips generally have a voltage trimming configuration. Accordingly, the voltage generator according to the second embodiment can generate the low voltage, which is lower than the normal voltage at which the semiconductor circuit normally operates, merely by providing the resistor of the trimming circuit with a switch and a terminal to connect the resistor and the switch. Specifically, an output voltage trimming circuit of an internal power supply regulator which is mounted on an existing semiconductor chip can be used. This configuration prevents an increase in the area for the configuration for changing the voltage, and this configuration can be easily implemented.

Thus, according to the voltage generator of the second embodiment and the semiconductor apparatus including the voltage generator, the voltage generator includes an operational amplifier and a resistor, and the voltage generator applies a reference voltage to a non-inverting input terminal of the operational amplifier, connects the resistor between an output and a ground, selects any one of a plurality of intermediate points of the resistor, and connects the selected intermediate point to an inverting input terminal of the operational amplifier. Therefore, the power supply voltage can be set to the low voltage, which is lower than the normal voltage at which the semiconductor circuit normally operates, without increasing the circuit size, and the semiconductor circuit is tested at the low voltage, which makes it possible to carry out tests under conditions that are stricter than the conditions in which the stable operation is guaranteed, and to determine whether the semiconductor circuit has deteriorated or not.

Third Embodiment

A third embodiment illustrates an example in which a configuration for storing fail information and a power supply voltage of a reset circuit are not changed even when the power supply voltage of the semiconductor circuit to be tested is changed.

Figure 8:
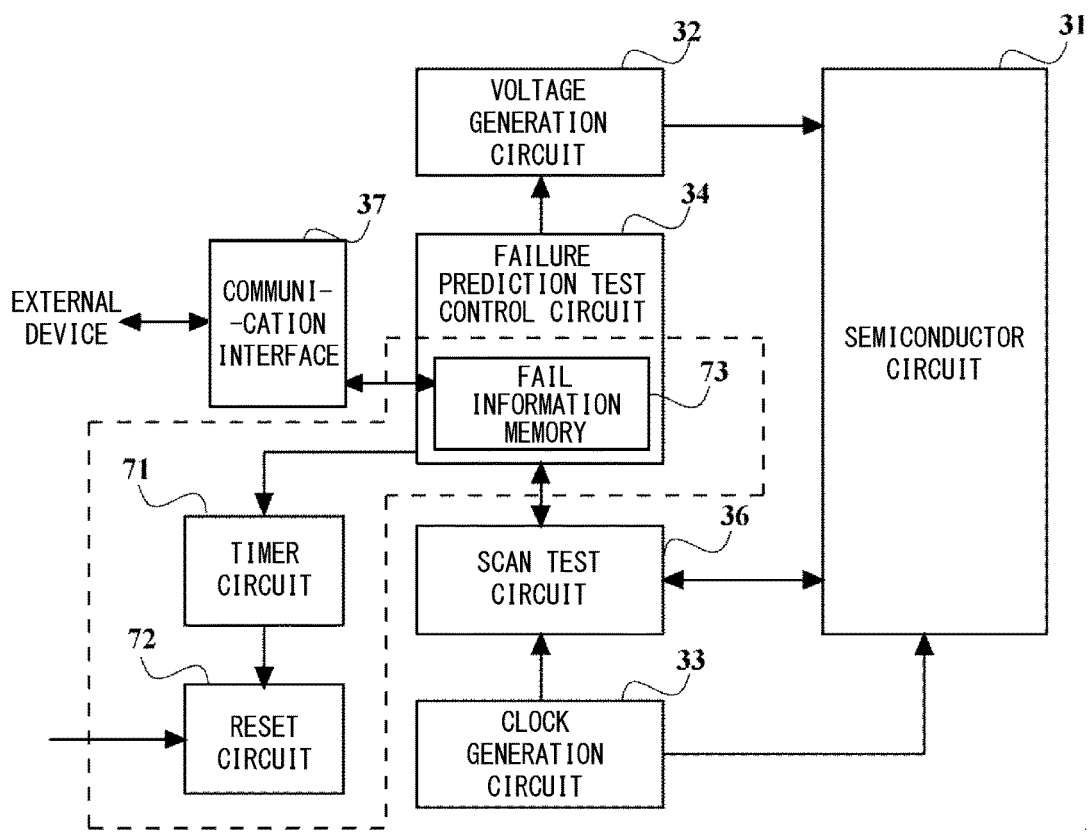
FIG. 8 is a block diagram showing a configuration of a semiconductor apparatus according to a third embodiment.

FIG. 8 is a block diagram showing a configuration of a semiconductor apparatus according to the third embodiment. In FIG. 8, components identical to those shown in FIG. 3 are denoted by the same reference numerals, and the descriptions thereof are omitted. Referring to FIG. 8, a semiconductor apparatus 70 includes the semiconductor circuit 31, the voltage generation circuit 32, the clock generation circuit 33, the failure prediction test control circuit 34, the scan test circuit 36, the communication interface 37, a timer circuit 71, a reset circuit 72, and a fail information memory 73.

The timer circuit 71 is composed of a watchdog timer. In a case where a regular watchdog operation (writing of a service pulse) is not carried out due to an invalid state, such as hung-up, and the operation has timed out, the timer circuit 71 sends a reset instruction to the reset circuit 72 as exceptional handling.

Upon receiving the reset instruction from the timer circuit 71, the failure prediction test control circuit 34, or another component, the reset circuit 72 resets the semiconductor apparatus 70. The reset circuit 72 includes a register that indicates a state after resetting.

The fail information memory 73 is a memory that stores test fail information.

The timer circuit 71, the reset circuit 72, and the fail information memory 73 operate at a constant voltage separately from the voltage generated by the voltage generation circuit 32. For example, the timer circuit 71, the reset circuit 72, and the fail information memory 73 operate at a power supply voltage Vcc which is applied to the semiconductor apparatus 70 from the outside.

Even in a case where a test is conducted at the low voltage, which is lower than the normal voltage at which the semiconductor circuit normally operates, and an abnormal operation is detected, the timer circuit 71, the reset circuit 72, and the fail information memory 73 are caused to operate at a constant power supply voltage. This allows the timer circuit 71, the reset circuit 72, and the fail information memory 73 to be reset without any abnormal operation.

Figure 9:
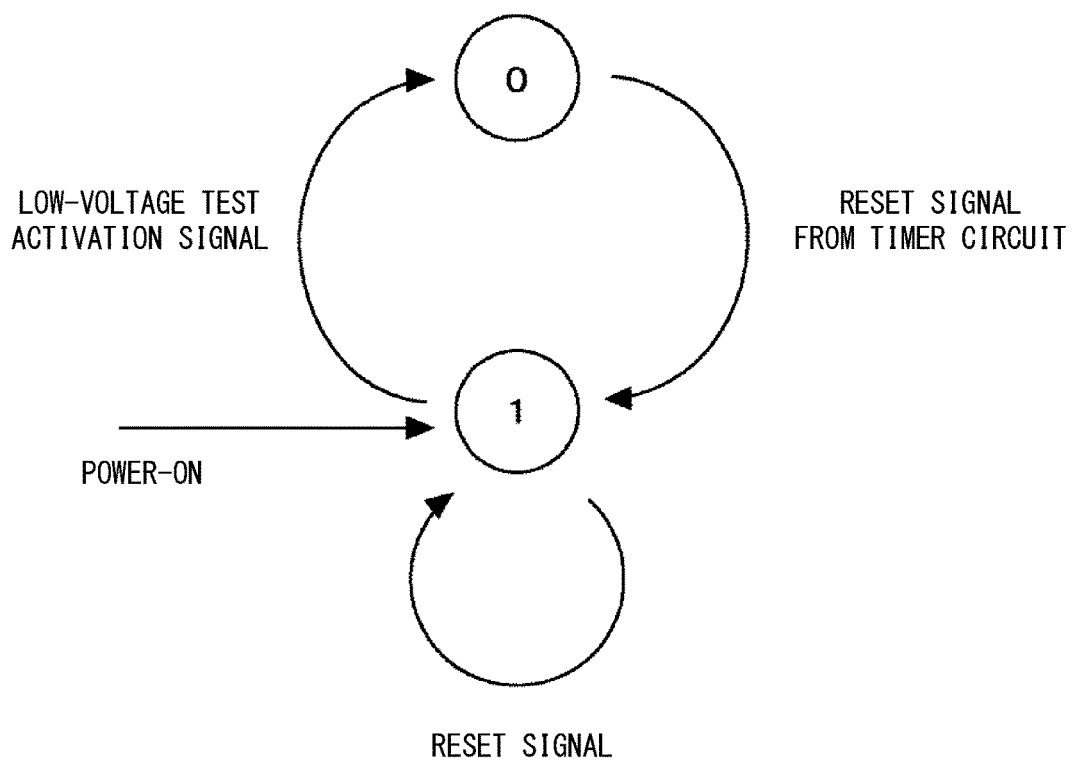
FIG. 9 is a diagram showing a state transition of a register included in a reset circuit of the semiconductor apparatus according to the third embodiment.

Next, the reset operation of the semiconductor apparatus 70 will be described. FIG. 9 is a diagram showing a state transition of the register included in the reset circuit of the semiconductor apparatus according to the third embodiment. As shown in FIG. 9, the register holds "0" or "1" using 1-bit data. If the register holds "0", the power supply voltage of the semiconductor circuit 31 is set to the low voltage after resetting, and the low-voltage test is activated. If the register holds "1", the operation mode is set to the normal operation mode in which the power supply voltage of the semiconductor circuit 31 is set to the normal voltage after resetting.

The reset circuit 72 sets "1" to the register at the time of power-on. Upon receiving a low-voltage test activation signal, the reset circuit 72 sets "0" to the register.

In this case, when the low-voltage test is normally terminated, the reset circuit 72 sets "1" to the register.

However, when the low-voltage test is not normally terminated, i.e., when the timer circuit 71 does not receive a predetermined signal from the failure prediction test control circuit within a predetermined period of time, the timer circuit 71 sends a reset instruction to the reset circuit 72. Then, the reset circuit 72 sets "1" to the register, and resets the semiconductor apparatus 70.

When the reset circuit 72 has received a reset signal in the state where "1" is set to the register, i.e., when the reset circuit 72 has received the reset instruction during the normal operation, the reset circuit 72 resets the semiconductor apparatus 70 in the state where "1" is set to the register.

Thus, when the signal which shifts to the normal operation state within a predetermined period of time is not generated after shifting from the normal operation state to the low-voltage test state, the timer circuit 71 generates the reset signal to restore the system to the normal operation state.

Thus, the semiconductor apparatus of the third embodiment includes a timer circuit that sends a reset instruction when the system is not restored to the normal state within a predetermined period of time. Also when a test is conducted at the low voltage, which is lower than the normal voltage at which the semiconductor circuit normally operates, the timer circuit and the reset circuit are executed at the normal voltage. This allows the system to be restored to the normal operation when the low-voltage test cannot be normally terminated.

Fourth Embodiment

Figure 10:
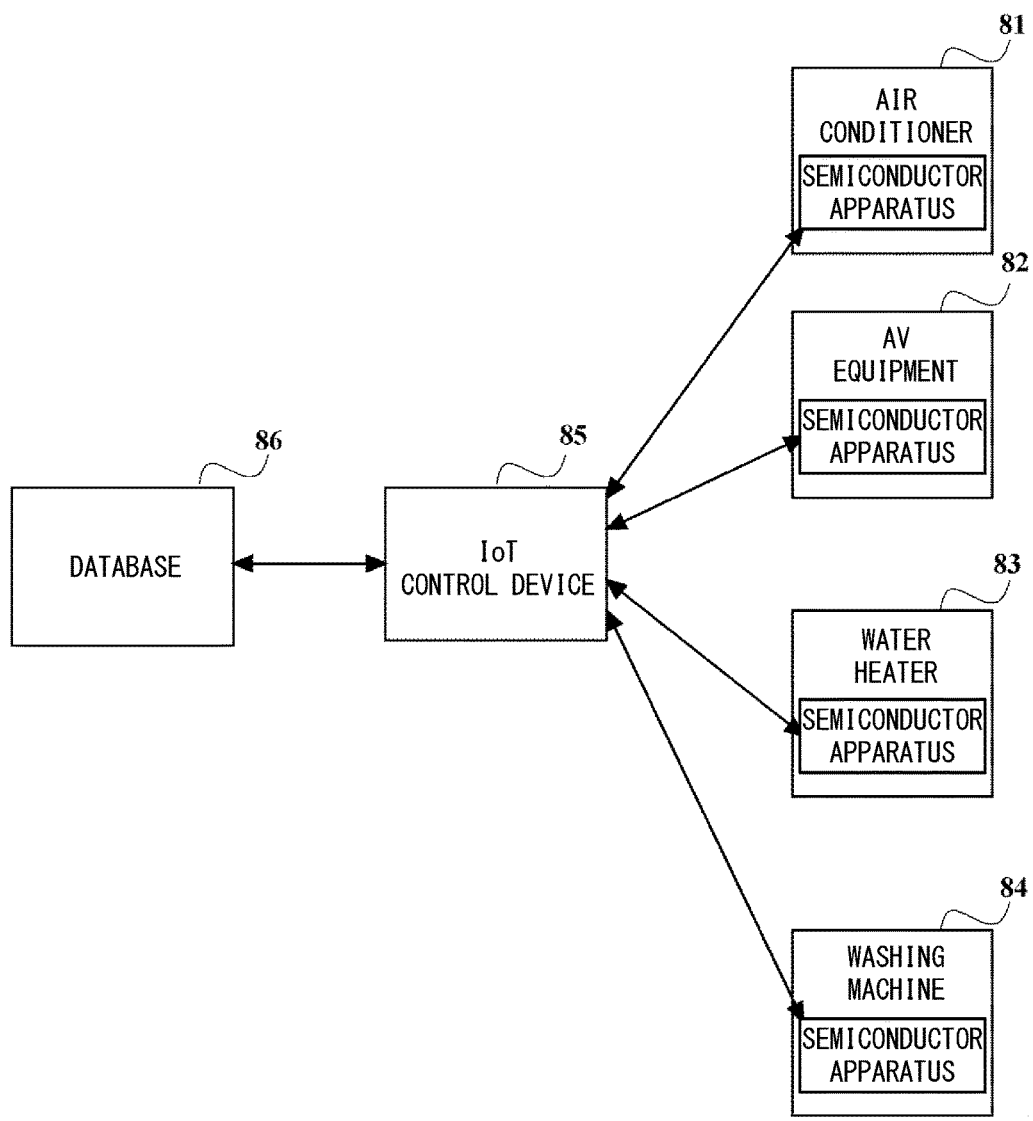
FIG. 10 is a schematic diagram showing a configuration of a system according to a fourth embodiment.

A fourth embodiment illustrates a system using the semiconductor apparatus according to the embodiments described above. FIG. 10 is a schematic diagram showing the configuration of the system according to the fourth embodiment. Referring to FIG. 10, a system 80 includes an air conditioner 81, an audio-visual (AV) equipment 82, a water heater 83, a washing machine 84, an IoT control device 85, and a database 86.

The air conditioner 81, the AV equipment 82, the water heater 83, and the washing machine 84 are electronic devices each including the semiconductor apparatus according to the embodiments described above, and exchange the low-voltage test fail information with the IoT control device 85. The configurations of the air conditioner 81, the AV equipment 82, the water heater 83, and the washing machine 84 are not particularly limited as long as they are electronic devices each including the semiconductor apparatus according to the embodiments described above.

The IoT control device 85 exchanges information about the low-voltage test result with the semiconductor apparatuses, which are incorporated in the air conditioner 81, the AV equipment 82, the water heater 83, and the washing machine 84, respectively, and outputs specific instructions on the low-voltage test to the air conditioner 81, the AV equipment 82, the water heater 83, and the washing machine 84.

The database 86 collects information about the results of the low-voltage test from the air conditioner 81, the AV equipment 82, the water heater 83, and the washing machine 84 via the IoT control device 85. Based on the accumulated results of the low-voltage test, the database 86 outputs instructions on the low-voltage test to the air conditioner 81, the AV equipment 82, the water heater 83, and the washing machine 84 via the IoT control device 85.

Next, the collection of information about the low-voltage test and the instructions on the low-voltage test based on the collected information will be described.

In a network composed of a plurality of systems, the IoT control device 85 can control tests and compare the test results in the semiconductor apparatuses of the air conditioner 81, the AV equipment 82, the water heater 83, and the washing machine 84. For example, if test patterns which are liable to deteriorate depending on the use environment of the product can be specified and the test patterns can be narrowed down, information about the test patterns may be shared with other semiconductor apparatuses via the network.

The IoT control device 85 accesses the low-voltage test fail information database in the same chip as that of the semiconductor apparatus to be controlled by the IoT control device 85, for example, via the Internet. The IoT control device 85 acquires information about the number of each low-voltage test pattern which is more likely to be determined to be fail, and controls, for example, the semiconductor apparatus mounted on the air conditioner 81 to conduct a test on the test pattern number. Alternatively, the IoT control device 85 acquires the content (information about the number of the test pattern determined to be fail) of the fail information memory of the semiconductor apparatus and transmits the content to the database 86.

In another alternative, in an initial stage before the accumulation of information about the number of each low-voltage test pattern which is more likely to be determined to be fail, a large number of semiconductor apparatuses of the same type used in the market may conduct tests with different test patterns in a distributed manner on, for example, the semiconductor apparatus mounted on the air conditioner 81. This leads to a reduction in the number of test patterns with which one semiconductor apparatus conducts a test.

Thus, the system according to the fourth embodiment includes a plurality of semiconductor apparatuses each including a semiconductor circuit, and a database. Each semiconductor apparatus applies the low voltage, which is lower than the normal voltage at which the semiconductor circuit normally operates, to the semiconductor circuit, supplies a clock signal with a constant frequency regardless of the power supply voltage, determines whether the semiconductor circuit normally operates or not, and transmits, to the database, information about regions of the semiconductor circuit in which the semiconductor circuit does not normally operate. Based on determination results of the plurality of semiconductor apparatuses, the database transmits, to the plurality of semiconductor apparatuses, an instruction to verify whether the semiconductor circuit normally operates in the regions in a descending order of the number of determination results indicating that the semiconductor circuit does not normally operate, thereby carrying out the low-voltage test. Therefore, failure prediction can be performed with high accuracy and high sensitivity with respect to the phenomenon of deterioration in the market.

The invention made by the present inventors has been described above based on embodiments. However, the present invention is not limited to the embodiments described above and can be modified in various ways without departing from the scope of the invention.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

The first, second, third and fourth embodiments can be combined as desirable by one of ordinary skill in the art.

What is claimed is:

1. A semiconductor apparatus comprising:
    a semiconductor circuit;
    a voltage generator that selects one of at least two types of voltages and applies the selected voltage to the semiconductor circuit, the at least two types of voltages including a normal voltage at which the semiconductor circuit normally operates and a low voltage which is lower than the normal voltage;
    a clock generator that generates a clock signal having only a predetermined frequency and supplies the semiconductor circuit with the generated clock signal;
    a test circuit that performs a test of the semiconductor circuit while the clock generator supplying the generated clock signal to the semiconductor circuit and the voltage generator supplying the at least two types of voltages to the semiconductor circuit, and determines, based on the test, whether the semiconductor circuit normally operates or not in state where the low voltage is applied to the semiconductor circuit; and
    a reset circuit that resets a power supply of the semiconductor apparatus when the test circuit cannot normally terminate a verification of operation of the semiconductor circuit within a predetermined period of time,
    wherein the reset circuit is supplied with a power supply voltage which is different from an output voltage of the voltage generator that selectively changes a voltage.

2. The semiconductor apparatus according to claim 1, further comprising a test control circuit that determines that the semiconductor circuit has deteriorated, when a test in a state where the low voltage is applied to the semiconductor circuit is not normally terminated and when a test in a state where the normal voltage is applied to the semiconductor circuit is normally terminated.

3. The semiconductor apparatus according to claim 1, wherein
    the voltage generator includes an operational amplifier and a resistor, and
    the voltage generator applies a reference voltage to one of differential input terminals of the operational amplifier, connects the resistor between an output and a ground, selects any one of a plurality of intermediate points of the resistor, and connects the selected intermediate point to the other differential input terminal of the operational amplifier.

4. The semiconductor apparatus according to claim 1, further comprising a communication interface that outputs, to an outside, a result of the determination of the test circuit as to whether the semiconductor circuit normally operates or not.

5. A system comprising:
    a plurality of semiconductor apparatuses each including:
    a semiconductor circuit;
    a voltage generator that selects one of at least two types of voltages and applies the selected voltage to the semiconductor circuit, the at least two types of voltages including a normal voltage at which the semiconductor circuit normally operates and a low voltage which is lower than the normal voltage;
    a clock generator that supplies the semiconductor circuit with a clock signal having a constant frequency regardless of the voltage to be applied to the semiconductor circuit; and
    a test circuit that performs a test of the semiconductor circuit while the voltage generator supplying the low voltage to the semiconductor circuit and determines, based on the test, whether the semiconductor circuit normally operates or not; and
    a database,
    wherein each semiconductor apparatus supplies at least through the clock generator thereof to the semiconductor circuit thereof with the clock signal having the constant frequency regardless of the voltage to be applied to the semiconductor circuit thereof, determines through the test circuit, while the clock generator thereof supplying the clock signal with the constant frequency to the semiconductor circuit thereof, whether the semiconductor circuit thereof normally operates or not, and transmits to the database, information about regions of the semiconductor circuit thereof in which the semiconductor circuit thereof does not normally operate, and
    based on determination results of the plurality of semiconductor apparatuses, the database transmits, to the plurality of semiconductor apparatuses, an instruction to verify whether the semiconductor circuit normally operates in the regions in a descending order of the number of determination results indicating that the semiconductor circuit does not normally operate.

* * * * *